(12) United States Patent
Wang et al.

(10) Patent No.: US 6,232,635 B1
(45) Date of Patent: May 15, 2001

(54) METHOD TO FABRICATE A HIGH COUPLING FLASH CELL WITH LESS SILICIDE SEAM PROBLEM

(75) Inventors: Larry Yu Wang, San Jose; Steven C. Avanzino, Cupertino; Jeffrey A. Shields, Sunnyvale, all of CA (US); Stephen Keetai Park, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/543,991

(22) Filed: Apr. 6, 2000

(51) Int. Cl.$^7$ ................................................. H01L 29/1788
(52) U.S. Cl. .................. 257/318; 257/315; 257/321; 257/319; 257/322; 365/185.14; 438/261; 438/558
(58) Field of Search .................... 257/318, 315, 257/321, 322; 438/261, 258, 264, 257; 365/185.14

(56) References Cited

U.S. PATENT DOCUMENTS

| | | | |
|---|---|---|---|
| 5,763,912 | * 6/1998 | Parat et al. | 257/315 |
| 5,841,165 | * 11/1998 | Chang et al. | 257/318 |
| 5,859,459 | 1/1999 | Ikeda | 257/374 |
| 5,885,883 | 3/1999 | Park et al. | 438/435 |
| 5,912,843 | * 6/1999 | Jeng | 365/185.14 |
| 5,943,261 | * 8/1999 | Lee | 365/185.14 |
| 6,058,045 | * 5/2000 | Pourkeramati | 365/185.17 |

FOREIGN PATENT DOCUMENTS

| | | |
|---|---|---|
| 0351316 | 1/1990 | (EP) . |
| 04208572 | 7/1992 | (JP) . |
| 09213783 | 8/1997 | (JP) . |

\* cited by examiner

*Primary Examiner*—Matthew Smith
*Assistant Examiner*—V. Yevsikov
(74) *Attorney, Agent, or Firm*—Foley & Lardner

(57) ABSTRACT

An article and method of manufacturing a semiconductor flash cell. The method includes producing an isolation formation layer on a silicon substrate, forming an oxide on the isolation formation layer, growing a tunnel oxide layer thereon, depositing a first poly silicon layer, masking and etching the first poly silicon layer, depositing a second poly silicon layer and performing a blanket etch back step, forming an oxide/nitride/oxide layer forming a third polysilicon layer and depositing a silicide layer thereon.

6 Claims, 3 Drawing Sheets

METHOD TO FABRICATE A HIGH COUPLING FLASH CELL WITH LESS SILICIDE SEAM PROBLEM

TECHNICAL FIELD

This invention is related to a semiconductor flash cell. More particularly, the invention is directed to an improved method and article of manufacture of a flash cell with large enhancement of the capacitance coupling ratio between a control gate and a floating gate of the flash cell. The invention is further directed in particular to increasing overlap area between the floating gate and the control gate.

BACKGROUND OF THE INVENTION

Conventional semiconductor flash cells (see FIGS. 1A and 1B) have a very low coupling ratio between the control gate of polycrystalline silicon (poly 2) and the floating gate of polycrystalline silicon (poly 1). The coupling ratio is defined as $C_2/(C_1+C_2)$ where $C_1$ is the capacitance between the floating gate and substrate of the semiconductor device, and $C_2$ is the capacitance between the control gate and the floating gate. Performance parameters of the flash cell are unnecessarily degraded by having such a low coupling ratio. It is therefore important to develop a method and article of manufacture to increase the coupling ratio. Further, conventional flash cells usually have a tungsten silicide seam formed which creates substantial degradation of electrical performance.

SUMMARY OF THE INVENTION

According to one form of the invention, an article of manufacture is obtained by the method of (1) isolation formation in a conventional manner by local oxidation of silicon (LOCOS) or by shallow trench isolation (STI), (2) formation of an oxide on the LOCOS along with masking and etching, (3) tunnel oxide growth adjacent the oxide and LOCOS and deposition of polycrystalline silicon (poly 1), (4) masking and etching of the poly 1, (5) deposition of another polycrystalline silicon (poly 2) and a blanket etch back step which forms a poly 1 spacer, (6) growth of an oxide/nitride/oxide layer (ONO), (7) deposition of a third polycrystalline silicon layer, (8) deposition of a silicide on the poly 2, (9) masking of the poly 2 and followed by conventional steps of processing a flash cell device structure.

These and other objects, features and advantages of the invention will be apparent from the following description of the preferred embodiments and examples, taken in conjunction with the accompanying drawings described hereinbelow.

DETAILED DESCRIPTION OF PREFERRED EMBODIMENTS

Figure 1A:
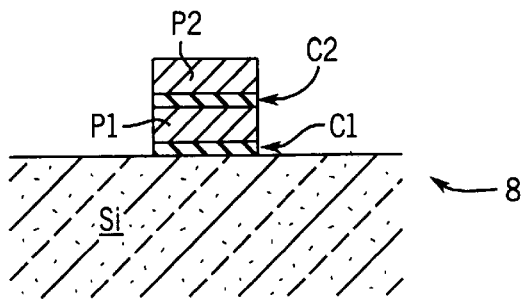
FIG. 1A illustrates a conventional arrangement of a semiconductor flash cell and capacitance coupling features.
Figure 1B:
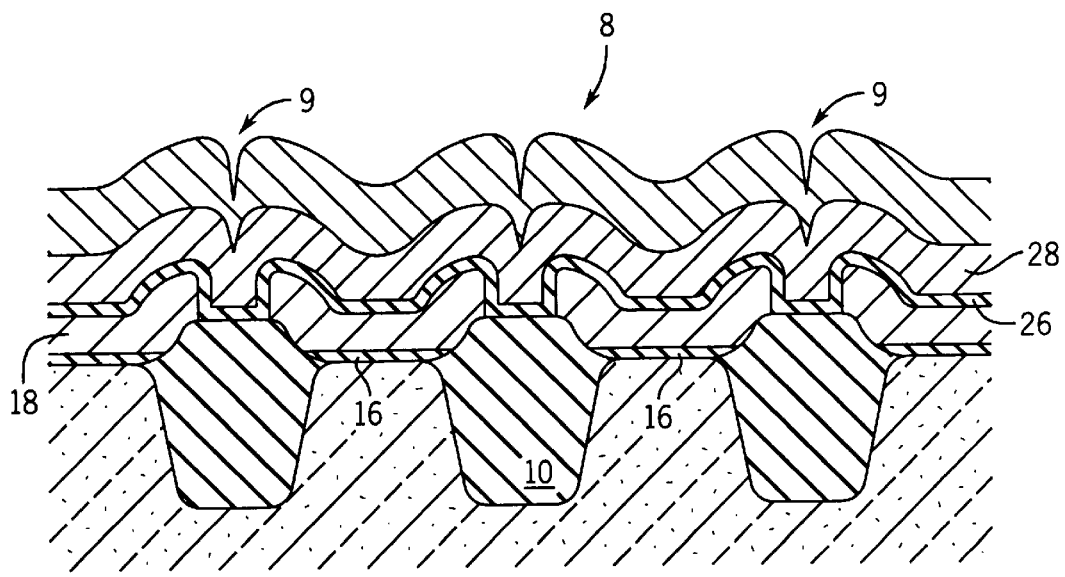
FIG. 1B illustrates details of the layer structure of the conventional flash cell of FIG. 1A.
Figure 2:
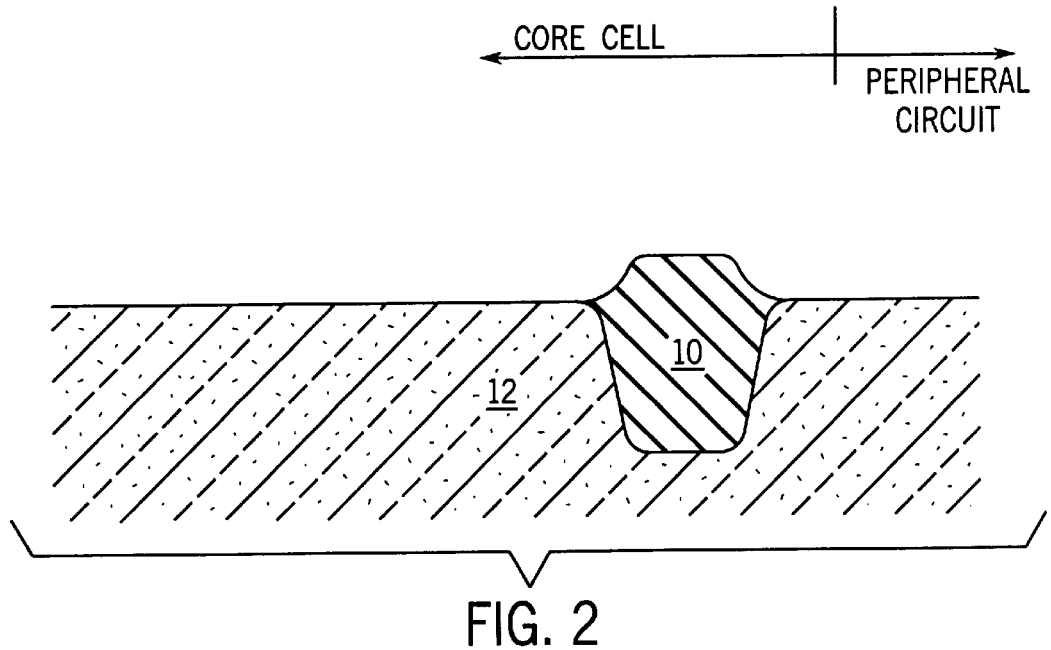
FIG. 2 illustrates isolation formation by a conventional method of STI.
Figure 3:
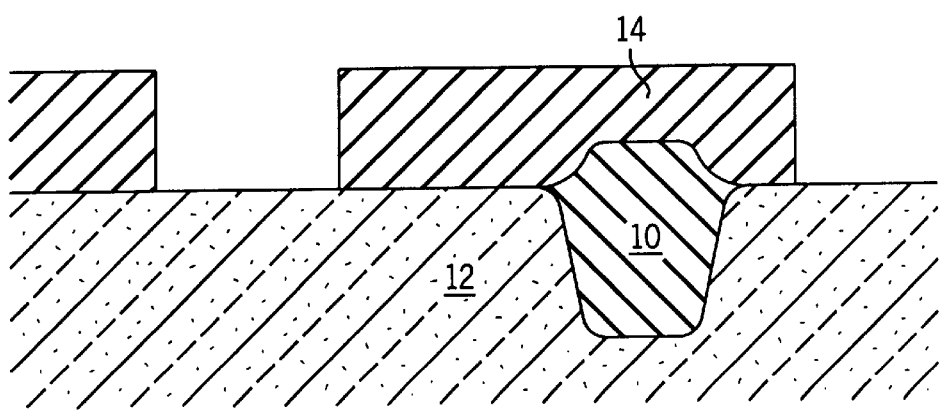
FIG. 3 illustrates a device structure after oxide deposition, masking and etching the oxide layer.

In order to overcome the previously described disadvantages associated with the low coupling ratio present in a conventional flash cell (8) (see FIGS. 1A and 1B), a preferred article of manufacture and method of the invention is shown by the device processing steps of FIGS. 2–6. Further, as noted in the previous discussion of the conventional flash cell 8 (see FIG. 1B), it is very likely there will be an undesirable tungsten silicide seam 9 created during fabrication of the flash cell 8. The following embodiments overcome the various disadvantages of the prior art. In FIG. 2 is shown an initial step of conventional isolation formation, such as forming a shallow trench isolation (STI) in silicon substrate 12, although forming local oxidation of silicon (LOCOS) region 10 can also accomplish the desired structural result. In FIG. 3 is shown the device structure after conventional chemical vapor deposition of oxide layer 14 on the substrate 12 (note: this can be combined with the step of forming the LOCOS region 10), masking the oxide layer 14 and etching the oxide layer 14, leaving portions of the oxide layer 14 above the LOCOS region 10.

Figure 4:
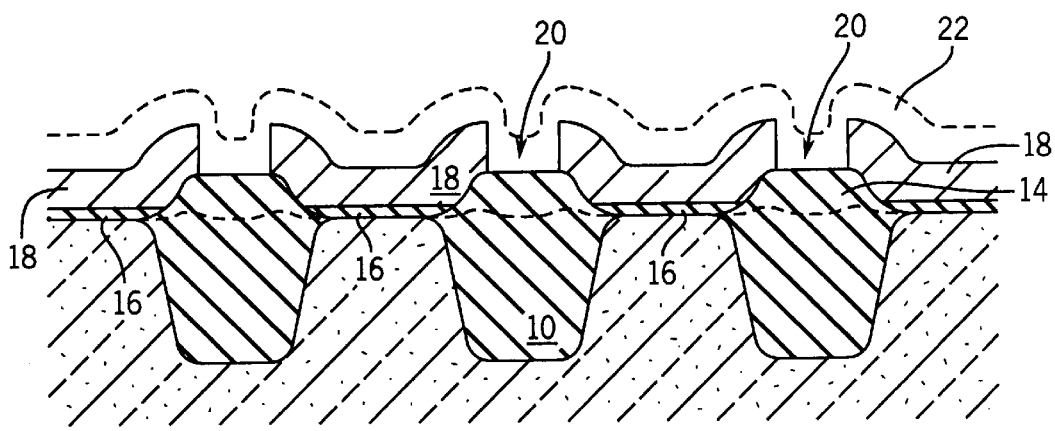
FIG. 4 illustrates a device structure after another deposition of poly 1 and a blanket etch back step.
Figure 5:
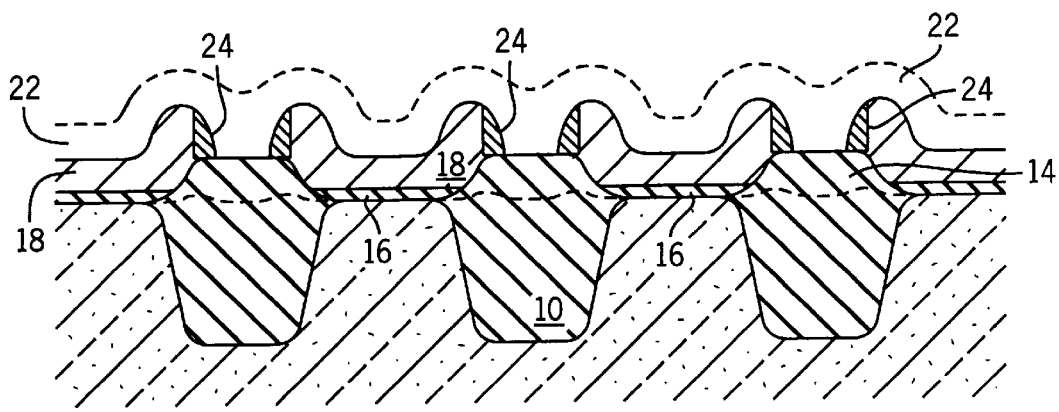
FIG. 5 illustrates the device structure after the steps of FIG. 4 yielding a poly 1 spacer.

In FIG. 4 is shown growth of a tunnel oxide 16 adjacent the oxide layer 14 and the LOCOS region 10, deposition of a polycrystalline silicon layer 18 (poly 1), and followed by a masking/etching step of the poly 1 layer 18 to form gaps 20 through the poly 1 layer 18 to the oxide layer 14. In FIGS. 4 and 5 are shown the device structure after deposition of a second polycrystalline silicon layer 22 (poly 1) in phantom. In FIG. 5 a blanket etch back step removes a portion of the poly 1 layer 22 except for a spacer portion 24 which is coupled to both the remaining poly 1 layer 18 and the oxide layer 14.

Figure 6:
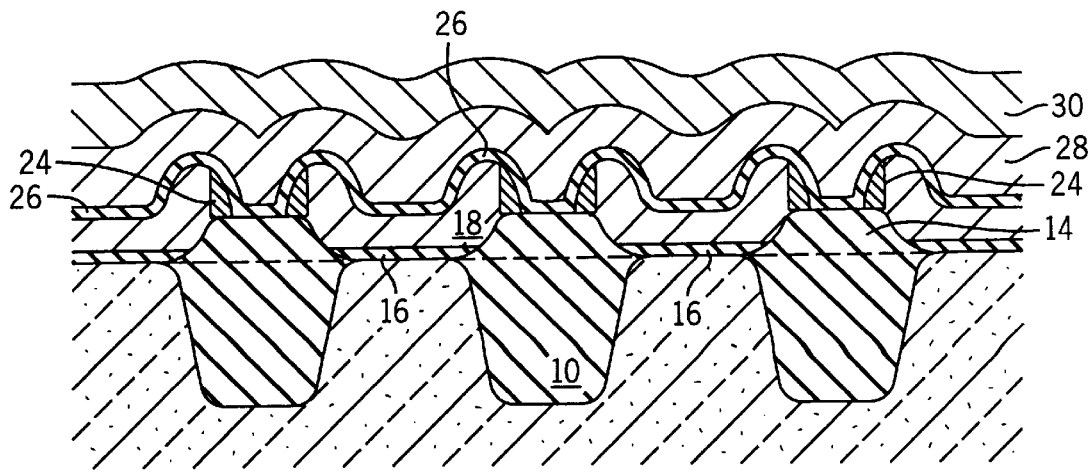
FIG. 6 illustrates the device structure after ONO growth with poly 2 and silicide deposition.

In FIG. 6 is shown formation of a oxide/nitride/oxide (ONO) layer 26, followed by deposition of yet another third polycrystalline silicon layer 28 (poly 2) and then deposition of a conventional silicide layer 30 thereon. The remainder of the processing is conventional in preparing a flash cell device for operation.

The resulting semiconductor flash cell device has substantially enhanced coupling ratio by virtue of the method of manufacture, thereby providing advantageous flash cell performance.

The following non-limiting examples illustrate an embodiment of the method and article of manufacture of the invention.

EXAMPLE I

This example concerns preparation of the tunnel oxide layer of the flash cell. In this process dry oxidation of a silicon layer is performed at about 800° C.–1000° C. This can be done with or without an HCl vapor. The resulting tunnel oxide is about 100 Å in thickness.

EXAMPLE II

The polycrystalline layer (both poly 1 and poly 2) are formed by conventional LP chemical vapor deposition at about 600° C. The resulting poly 1 layer is about 100 Å in thickness and the resulting poly 2 layer is about 1000–2000 Å in thickness.

EXAMPLE III

A layer of tungsten silicide for the flash cell was formed by conventional CVD methods using $WF_6$ to form a layer of about 1000–2000 Å thickness.

What is claimed is:

1. An article of manufacture of a semiconductor flash cell, comprising:

a silicon substrate;

an isolation formation layer including an upper oxide portion;

a tunnel oxide disposed adjacent said isolation formation layer;

a first polycrystalline silicon layer having a via to said upper oxide portion;

a spacer portion of polycrystalline silicon disposed along at least a part of said via and coupled to said first polycrystalline silicon layer;

an oxide/nitride/oxide disposed on said first polycrystalline silicon layer, said spacer portion and said upper oxide portion; and a second polycrystalline silicon layer and a silicide layer disposed thereon.

2. The article of manufacture as defined in claim 1 wherein said upper oxide portion comprises a chemical vapor deposited oxide.

3. The article of manufacture as defined in claim 1 wherein said isolation formation layer is selected from the group consisting of a local oxidized silicon (LOCOS) and a shallow trench isolation layer (STI).

4. The article of manufacture as defined in claim 1 wherein said upper oxide portion comprises a silicon oxide.

5. The article of manufacture as defined in claim 1 wherein said oxide/nitride/oxide layer comprises compounds of silicon.

6. The article of manufacture as defined in claim 1 wherein said silicide layer is selected from the group consisting of WSi, TiSi and CoSi.

* * * * *